US008685295B2

(12) United States Patent
Vermeulen et al.

(10) Patent No.: US 8,685,295 B2
(45) Date of Patent: Apr. 1, 2014

(54) IMPRINT LITHOGRAPHY APPARATUS

(75) Inventors: Johannes Petrus Martinus Bernardus Vermeulen, Helmond (NL); Andre Bernardus Jeunink, Bergeijk (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 571 days.

(21) Appl. No.: 12/821,749

(22) Filed: Jun. 23, 2010

(65) Prior Publication Data
US 2011/0003023 A1  Jan. 6, 2011

Related U.S. Application Data

(60) Provisional application No. 61/213,701, filed on Jul. 6, 2009.

(51) Int. Cl.
*B29C 35/08* (2006.01)
*B29C 59/16* (2006.01)
*B29C 67/00* (2006.01)

(52) U.S. Cl.
CPC ............ *B29C 67/0051* (2013.01); *Y10S 425/81* (2013.01)
USPC .......... 264/40.1; 264/293; 264/320; 264/322; 264/345; 264/496; 425/174.4; 425/385; 425/403; 425/408; 425/810; 430/302; 700/89; 700/118

(58) Field of Classification Search
CPC ............................... B29C 35/02; B29C 59/002
USPC ............. 425/385, 174, 174.4, 403, 408, 810; 264/40.1, 40.5, 293, 320, 322, 345, 264/496; 700/89, 118; 430/302
See application file for complete search history.

(56) References Cited

U.S. PATENT DOCUMENTS

| 4,731,155 | A | 3/1988 | Napoli et al. |
| 5,772,905 | A | 6/1998 | Chou |
| 6,334,960 | B1 | 1/2002 | Willson et al. |
| 6,717,296 | B2 * | 4/2004 | Van Der Schoot et al. ............ 310/12.07 |
| 7,665,983 | B2 * | 2/2010 | Kendale et al. ............... 425/546 |
| 2004/0124566 | A1 | 7/2004 | Sreenivasan et al. |
| 2005/0274693 | A1 | 12/2005 | Heidari et al. |
| 2008/0024741 | A1 * | 1/2008 | Butler et al. ..................... 355/18 |

FOREIGN PATENT DOCUMENTS

WO    02/067055 A2    8/2002

OTHER PUBLICATIONS

J. Haisma et al., "Mold-assisted nanolithography: A process for reliable pattern replication," J. Vac. Sci. Technol. B 14 (6), Nov./Dec. 1996, pp. 4124-4128.

* cited by examiner

*Primary Examiner* — Joseph S Del Sole
*Assistant Examiner* — Thukhanh Nguyen
(74) *Attorney, Agent, or Firm* — Pillsbury Winthrop Shaw Pittman LLP

(57) ABSTRACT

An imprint lithography apparatus is disclosed. The apparatus includes an electromagnetic Lorentz actuator arrangement configured to move an imprint template arrangement, the electromagnetic Lorentz actuator arrangement comprising: an array of magnets; and an array of conductors, each conductor configured to carry an electric current, one of the array of magnets or the array of conductors being moveable and connected to the imprint template arrangement, and the other of the array of magnets or the array of conductors extending at least partially around or forming a part of a substrate holder; the array of magnets and the array of conductors together being in a configuration which facilitates moving of the moveable one of the array of magnets or the array of conductors in six degrees of freedom, such that the imprint template arrangement is also movable in six degrees of freedom.

20 Claims, 6 Drawing Sheets

IMPRINT LITHOGRAPHY APPARATUS

This application claims priority and benefit under 35 U.S.C. §119(e) to U.S. Provisional Patent Application No. 61/213,701, entitled "Imprint Lithography Apparatus", filed on Jul. 6, 2009. The content of that application is incorporated herein in its entirety by reference.

FIELD

The present invention relates to an imprint lithography apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves, the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve contacting a patterned surface of an imprint template with a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface contacts the imprintable medium. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium droplets on the surface of a substrate to be patterned.

SUMMARY

In order to accurately and consistently apply a pattern in the imprintable medium, it is desirable to be able to accurately position an imprint template arrangement relative to a target portion of a substrate (i.e. a portion of the substrate onto which a pattern is to be imprinted). The imprint template arrangement may be an imprint template, an imprint template holder (that may hold an imprint template), or an imprint template holder that is holding an imprint template.

In order to accurately and consistently apply a pattern in the imprintable medium, it is desirable to be able to accurately position the imprint template arrangement in or with six degrees of freedom, the six degrees of freedom being: movement along a first axis; movement along a second axis; and movement along a third axis, the first, second and third axes being orthogonal with respect to one another; rotation about the first axis; rotation about the second axis; and rotation about the third axis. In Cartesian coordinates, the first, second and third axis may be, for example, the x-axis, y-axis and z-axis respectively. The x and y-directions may extend substantially parallel to a surface of the substrate onto which the pattern is to be imprinted. The z-axis may extend substantially perpendicular to the substrate surface. Positioning of the template along the z-axis, and rotation about the x and y axis may be undertaken with an actuator arrangement located on an opposite side of the imprint template arrangement to the substrate into which a pattern is to be imprinted (i.e. above the imprint template arrangement). Positioning of the imprint template arrangement along the x and/or y-axes, and rotation about the z-axis may be undertaken by one or more actuator arrangements that are located around (for example in the same plane as) the imprint template arrangement.

Existing actuator arrangements to position an imprint template arrangement in or with six degrees of freedom are cumbersome (e.g. because of stacking of actuators), and take up a significant amount of space. It is desirable to provide an actuator arrangement that is less cumbersome and takes up less space. A less cumbersome arrangement may be accelerated and decelerated more rapidly, allowing the imprint template arrangement to also be accelerated and decelerated more rapidly. This may increase throughput by allowing more imprints to be undertaken in a given time. An actuator arrangement taking up less space might allow further useful apparatus to be located in that space. Alternatively or additionally, an actuator arrangement that takes up less space may make it possible or easier to implement a multiple imprint template arrangement configuration, in which more than one imprint template arrangement is used to imprint patterns onto a substrate. The use of a multiple imprint template arrangement configuration has a benefit of improving throughput of patterns imprinted onto the substrate.

It is desirable, for example, to provide an imprint lithography apparatus that obviates or mitigates at least one problem, whether identified herein or elsewhere, or which provides an alternative to an existing imprint lithography apparatus.

According to an aspect, there is provided an imprint lithography apparatus comprising: an imprint template arrangement for use in imprinting a pattern into an imprintable medium provided on a substrate; a substrate holder configured to hold the substrate; an electromagnetic Lorentz actuator arrangement configured to move the imprint template arrangement, the electromagnetic Lorentz actuator arrangement comprising: an array of magnets, and an array of conductors, each conductor configured to carry an electric current, one of the array of magnets or the array of conductors being moveable and connected to the imprint template arrangement, and the other of the array of magnets or the array of conductors extending at least partially around or forming a part of the substrate holder, and the array of magnets and the array of conductors together being in a configuration which facilitates moving of the moveable one of the array of magnets or the array of conductors in six degrees of freedom, such that the imprint template arrangement is also movable in six degrees of freedom.

The moveable one of the array of conductors or the array of magnets is moveable relative to the other (fixed) array of conductors or array of magnets, along side and/or around the substrate (i.e. not over, above or across the substrate).

The apparatus may further comprise one or more further imprint template arrangements, each further imprint template arrangement being connected to a further moveable one of an array of magnets or an array of conductors, the other of the array of magnets or the array of conductors extending at least partially around or forming a part of the substrate holder.

The apparatus may further comprise an actuator configured to deform or hold the imprint template arrangement.

The apparatus may further comprise a structure located away from the substrate holder and extending across the substrate holder, and such that the imprint template arrangement is, in use, located between the structure and the substrate holder, the structure having one or more arrays of lines, and the imprint template arrangement having one or more encoders that face towards one or more of the one or more arrays of lines.

A number and/or arrangement of the one or more arrays of lines, and a number and/or arrangement of the one or more encoders, may together be sufficient to be able to determine a relative configuration between the imprint template arrangement and the structure in four degrees of freedom, the four degrees of freedom being: translation in first direction; translation in second direction; rotation; and expansion or contraction.

The relative configuration may be one or more of a relative translational position, a relative rotational position, or a relative degree of expansion (e.g. a relative position or orientation).

A number and/or arrangement of the one or more arrays of lines, and a number and/or arrangement of the one or more encoders, may together be sufficient to be able to determine a relative configuration between the imprint template arrangement and the structure in six degrees of freedom, the six degrees of freedom being: translation in first direction; translation in second direction; translation in a third direction (e.g. in three orthogonal directions) and rotation about the first, second and third directions.

The array of lines may comprise lines extending in a first direction and lines extending in a second direction, and wherein the encoders may comprise: at least four encoders, at least two of the at least four encoders each being configured to determine movement in a direction relative to the first direction, and at least two others of the four encoders each being configured to determine movement in a direction relative to the second direction, the at least four encoders located around the imprint template arrangement; or at least two encoders, each of at least two encoders configured to determine movement in a direction relative to the first direction and a direction relative to the second direction, the two encoders being located around the imprint template arrangement.

The direction relative to the first direction may be substantially perpendicular to the first direction, and the direction relative to the second direction may be substantially perpendicular to the second direction.

The first direction may be substantially perpendicular to the second direction.

The array of magnets may be provided with Hallbach elements (e.g. located in between magnets of the array) that are configured to enhance the magnetic flux outside of the array of magnets.

The apparatus may further comprise a control arrangement configured to pass a current through a conductor of the array of conductors to move the moveable one of the array of magnets or the array of conductors.

Magnets of the array of magnets may have a north pole and a south pole, the north pole and south pole of one or more magnets of the array of magnets being aligned in a first direction, and the north pole and south pole of one or more other magnets of the array of magnets being aligned in a second, different, direction, the first direction and second direction being substantially parallel and opposite to one another.

One or more conductors of the array of conductors may be configured such that current may be carried in a first direction and/or a second direction. The first and second directions may be substantially perpendicular to one another.

The moveable one of the array of magnets or the array of conductors is, in use, configured to levitate (i.e. be free floating) above the other of the array of conductors or the array of magnets. This may be achieved by the generation of one or more (Lorentz) forces by the passing of an appropriate current through one or more conductors of the array of conductors.

The array of conductors may be moveable and be connected to the imprint template arrangement (the array of magnets being fixed in position); or the array of magnets may be moveable and be connected to the imprint template arrangement (the array of conductors being fixed in position).

The six degrees of freedom are: movement along a first axis; movement along a second axis; movement along a third axis, the first, second and third axes being orthogonal with respect to one another; rotation about the first axis; rotation about the second axis; and rotation about the third axis.

The imprint template arrangement may be an imprint template, an imprint template holder (that may hold an imprint template), or an imprint template holder that is holding an imprint template.

BRIEF DESCRIPTION OF THE DRAWINGS

Specific embodiments of the invention will be described with reference to the accompanying Figures, in which.

DETAILED DESCRIPTION

Figure 1A:
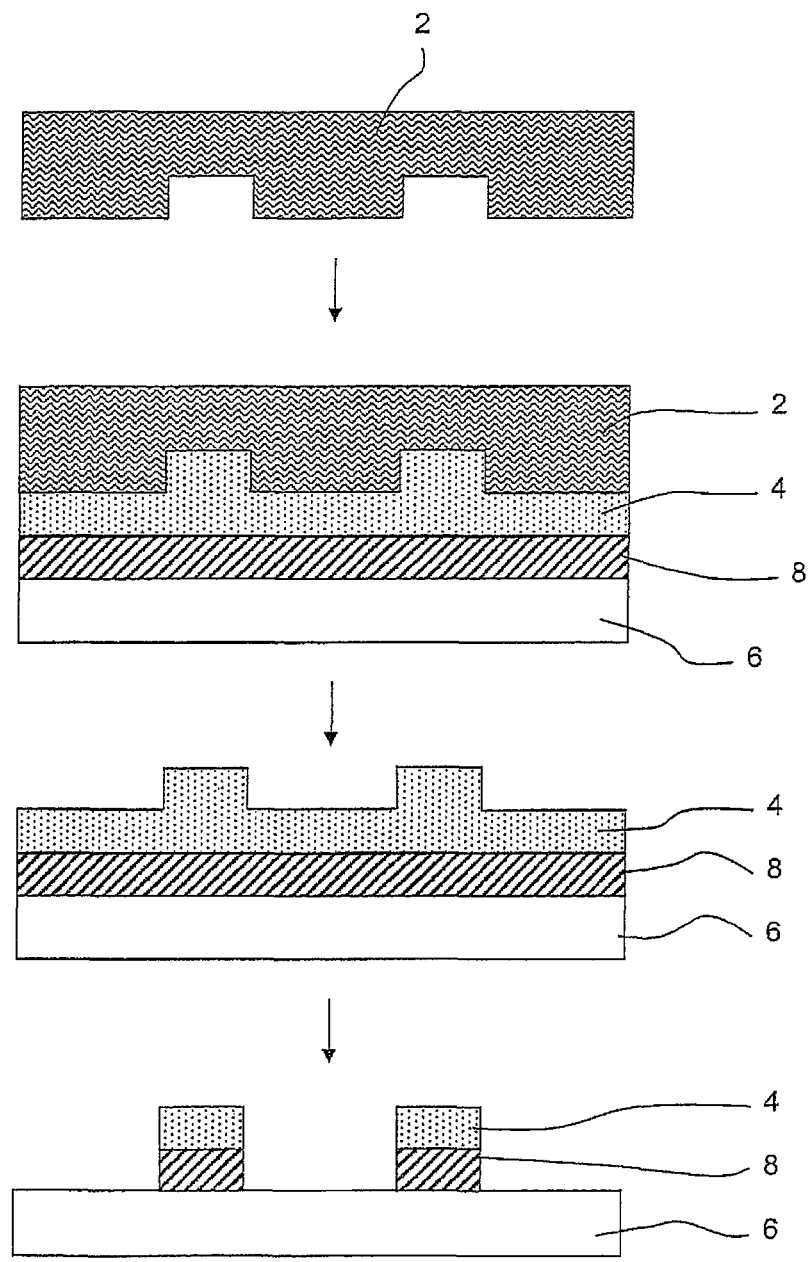
FIGS. 1a and 1b schematically depict examples of, respectively, hot imprint, and UV imprint lithography.
Figure 1B:
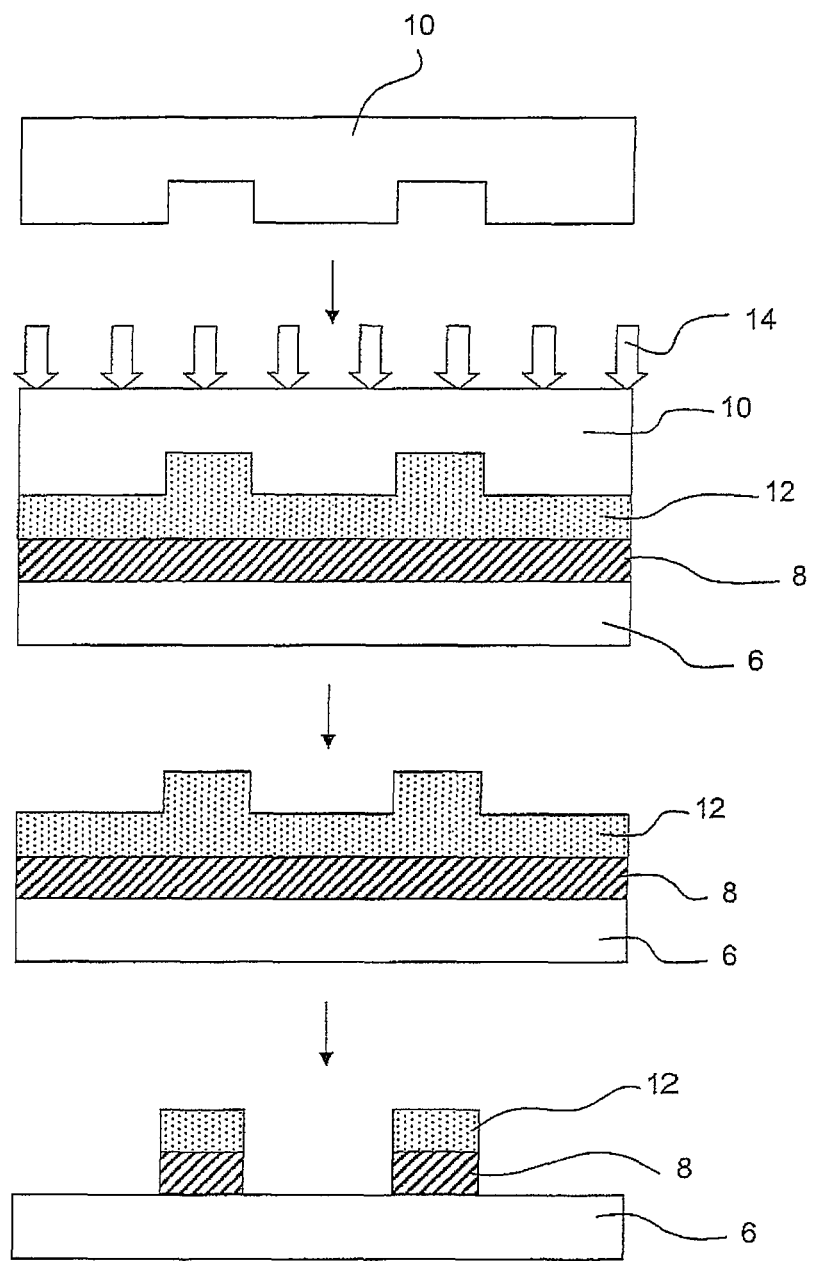

Examples of two known approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may be, for instance, spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template contacts the flowable resin, which is then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable imprintable medium 12 in a similar manner to the process of FIG. 1a. However, instead of using heat or temperature cycling as in hot imprint, the pattern is frozen by curing the imprintable medium with UV radiation 14 that is applied through the quartz template onto the imprintable medium. After removal of the template, the pattern will consist of the features in relief from a residual layer of the imprintable medium which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted, nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

Figure 2:
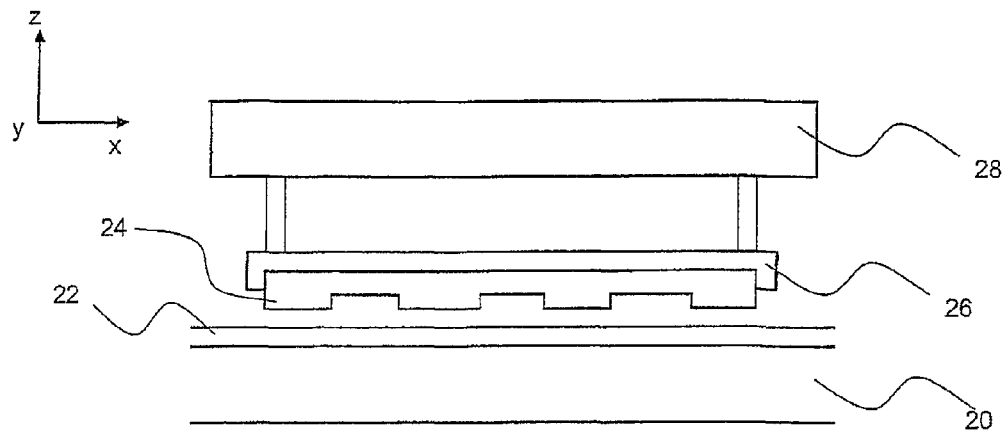
FIG. 2 schematically depicts an embodiment of an imprint template arrangement and an actuator arrangement configured to position that imprint template arrangement.

FIG. 2 schematically depicts a substrate 20. Provided on that substrate 20 is a layer of imprintable medium 22. One or more patterns may be imprinted into the imprintable medium 22 by imprinting an imprint template 24 into the imprintable medium 22.

The imprint template 24 is held by an imprint template holder 26. The imprint template holder 26 is connected to an actuator arrangement 28.

The actuator arrangement 28 is used to position the imprint template holder 26 and thus the imprint template 24 that is held by the imprint template holder 26. The actuator arrangement 28 may position the imprint template holder 26 and thus the imprint template 24 with or in six degrees of freedom: movement in a first direction (e.g. the x-direction), movement in a second direction (e.g. the y-direction), movement in a third direction (e.g. the z-direction), and rotation about the first direction (e.g. rotation about the x-direction), rotation about the second direction (e.g. rotation about the y-direction), and rotation about the third direction (e.g. rotation about the z-direction). Such movement can be achieved by appropriate movement of the actuator arrangement 28, or activation or the like of actuators forming part of or being attached to the actuator arrangement 28.

Known actuator arrangements are cumbersome and take up a significant amount of space. The cumbersome nature of known actuator arrangements makes it difficult to easily accelerate and decelerate the actuator arrangements and the imprint template holder and imprint template attached to the actuator arrangement. This can increase the time taken for each imprint, and therefore cause a reduction in throughput. The significant amount of space taken up by the actuator arrangement is space which could otherwise be taken up by other components of an imprint lithography apparatus. Furthermore, the significant amount of space taken up by an actuator arrangement may make it difficult or impossible to practically implement a multiple imprint template arrangement configuration, in which a plurality of imprint template arrangements are used in parallel to imprint patterns onto different areas of one or more substrates either in parallel or in quick succession.

According to an embodiment of the invention, there is provided an imprint lithography apparatus. The imprint lithography apparatus comprises an imprint template arrangement for use in imprinting a pattern into imprintable medium provided on a substrate. The imprint template arrangement may be or comprise an imprint template, an imprint template holder configured to hold an imprint template, or an imprint template holder that is holding an imprint template. The imprint lithography apparatus further comprises a substrate holder configured to hold the substrate. An electromagnetic Lorentz actuator arrangement is also provided, to move the imprint template arrangement. The electromagnetic Lorentz actuator arrangement comprises an array of magnets and an array of conductors. Each conductor of the array of conductors is configured to carry a current (i.e. the conductors are electrical conductors). One of the array of magnets or the array of conductors is moveable and is connected to the imprint template arrangement. The other (i.e. not moveable) of the array of magnets or the array of conductors extends at least partially around and/or form a part of the substrate holder. The array of magnets and the array of conductors together are in a configuration which facilitates moving of the moveable one of the array of magnets or the array of conductors in or with six degrees of freedom. Since the moveable one of the array of magnets or array of conductors is connected to the imprint template arrangement, the configuration is such that the imprint template arrangement is also moveable in six degrees of freedom.

The use of an electromagnetic Lorentz actuator arrangement is advantageous for a number of reasons. One reason is that an electromagnetic Lorentz actuator provides smooth and almost friction free movement. A further advantage is that a single electromagnetic Lorentz actuator arrangement can provide for moving of the imprint template arrangement in or with six degrees of freedom (i.e. there is no need for actuators in different planes relative to the imprint template in order to move the imprint template relative to those different planes). Parts of the electromagnetic Lorentz actuator arrangement needed to be able to move the imprint template arrangement in or with six degrees of freedom may be located in a single actuator unit in a single plane, reducing the size or complexity of the actuator in comparison with existing actuators. A Lorentz force used to move the imprint template arrangement is proportional to the current carried by the conductor on which the force is acting. Thus, accurate control of the current can yield accurate control of the force on the conductor and therefore movement of the imprint template arrangement.

Because only a single arrangement is used, less space is taken up than with existing actuator arrangements. This means that this space can be used for other apparatus, and the extra space may make it possible or easier to construct a multiple imprint template arrangement configuration.

An array, as used herein, of magnets or conductors is one or more magnets or conductors that have a defined orientation, position, configuration or layout (i.e. the arrangement, configuration, position or layout is not random but predetermined). An array can be a line of magnets or conductors, or a plurality of lines arranged in columns or rows for example. For example, the array may have a checkerboard pattern or the like.

Specific embodiments of the invention will now be described, by way of example only, with reference to FIGS. 3 to 13.

Figure 3:
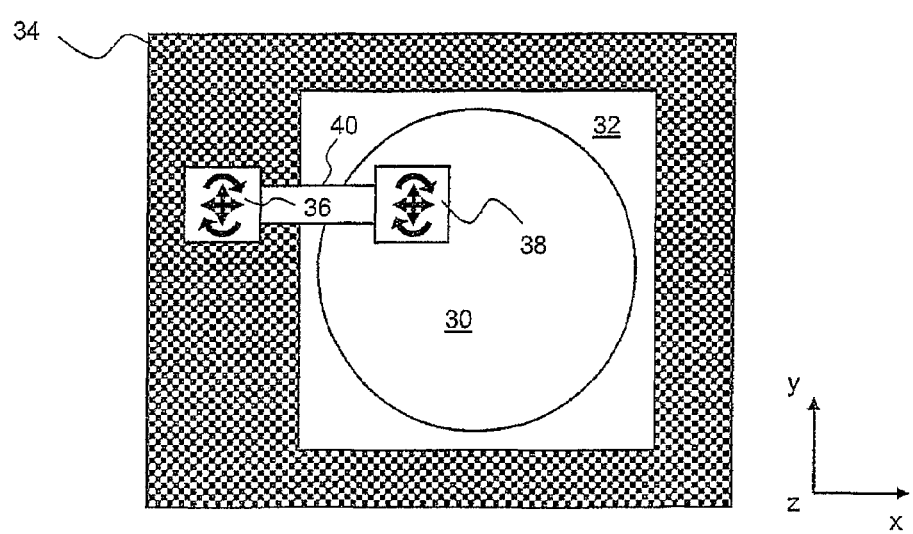
FIG. 3 schematically depicts a plan view of an imprint apparatus comprising an electromagnetic Lorentz actuator arrangement in accordance with an embodiment of the invention.

FIG. 3 schematically depicts a plan view of an imprint lithography apparatus in accordance with an embodiment of the invention. A substrate 30 is held in position by a substrate holder 32. Surrounding the substrate holder 32 is an array of magnets 34. The apparatus also comprises an array of conductors 36. Each conductor in the array is configured to carry an electric current. The array of conductors 36 is moveable relative to the array of magnets 34, along side and/or around the substrate (i.e. not over, above or across the substrate). The array of conductors 36 is connected to an imprint template arrangement 38. The connection between the array of conductors 36 and the imprint template arrangement 38 is made by a connecting member 40. The connecting member may be, for example, a frame, a support, a strut or any other suitable connecting member.

In use, the moveable array of conductors 36 is configured to levitate (i.e. free float) relative to (e.g. above) the array of magnets 34. Such levitation may be achieved by controlling the current that passes through one or more conductors of the array of conductors 36 to generate a Lorentz force on the conductor in the z-direction, away from the array of magnets 34. Such control of the current that passes through one or more conductors of the array of conductors 36, in combination with a suitable configuration of the array of magnets 34, leads to a situation in which the movement (i.e. position) of the array of conductors 36 can be controlled in six degrees of freedom: movement along a first axis (e.g. the x-direction), movement along a second axis (e.g. the y-direction), movement along a third axis (e.g. the z-direction), the first, second and third directions being orthogonal with respect to one another, and rotation about the first axis (e.g. rotation about the x-direction), rotation about the second axis (e.g. rotation about the y-direction) and rotation about the third axis (e.g. rotation about the z-direction). Because the array of conductors 36 is connected to the imprint template arrangement 38 by way of a connecting member 40, movement (i.e. positioning) of the array of conductors 36 also leads to similar or substantially identical (depending on the flexibility and other mechanical properties of the connecting member 40) movement (i.e. positioning) of the imprint template arrangement 38. A control arrangement (not shown) may be provided to control the current that is passed through one or more of the conductors of the array of conductors 36.

FIG. 3 includes arrows depicting movement of the array of conductors 36 in the y-direction and x-direction, and also rotation about the z-direction. FIG. 3 also includes arrows depicting the corresponding movement of the imprint template arrangement 38 in the x-direction, y-direction or rotation about the z-direction.

Figure 4:
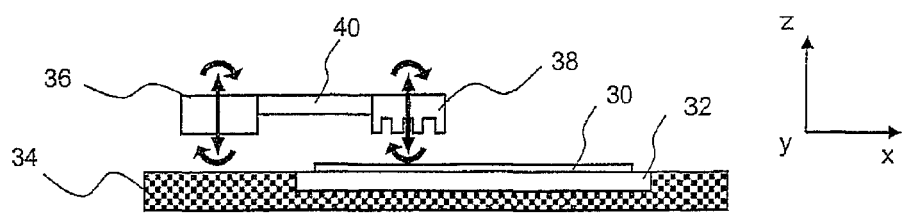
FIG. 4 schematically depicts a side view of the apparatus shown in and described with reference to FIG. 3.

FIG. 4 is a side-on view of the apparatus shown in and described with reference to FIG. 3. FIG. 4 schematically depicts the array of conductors 36 levitating above the array of magnets 34. Arrows in FIG. 4 schematically depict possible movement of the array of conductors 36 in the z-direction, and alternatively or additionally rotation about the y-direction. Corresponding movement of the imprint template arrangement 38 is also shown by way of arrows.

Figure 5:
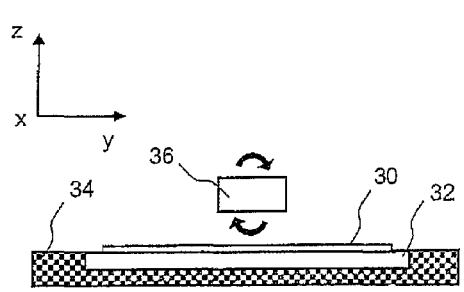
FIG. 5 schematically depicts an end-on view of the apparatus shown in and described with reference to FIG. 3.
Figure 6:
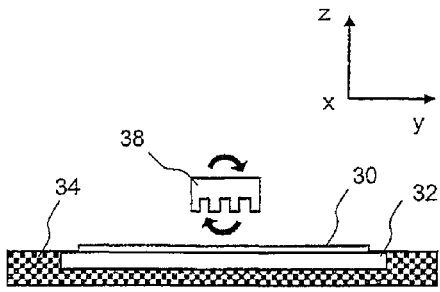
FIG. 6 schematically depicts a different end-on view of the apparatus shown in and described with reference to FIG. 3.

FIG. 5 is an end-on view of the apparatus shown in and described with reference to FIG. 3. Arrows in FIG. 5 schematically depict the possible rotation of the array of conductors 36 about the x-direction. FIG. 6 is an opposite end-on view of the apparatus shown in FIG. 5, wherein arrows schematically depict corresponding rotation of the imprint template arrangement 38 about the x-direction.

Movement (i.e. positioning) of the imprint template arrangement in six degrees of freedom may be used in any one of a number of ways. For instance, movement in an x or y-direction (e.g. parallel to a surface of the substrate), or rotation about a z-direction (e.g. rotation parallel to the substrate) may be used to position and/or align the imprint template arrangement prior to a pattern being imprinted into imprintable medium on the substrate. Movement in the z-direction may be used to imprint the imprint template arrangement into the imprintable medium or to release the imprint template arrangement after it has been imprinted into imprintable medium. Rotation in one or more of the x, y or z-directions may be used, for example, to take into account a topography of the imprintable medium or the substrate onto which the imprintable medium has been provided, or to take into account deformation of the substrate due to heating or the like. Alternatively or additionally, rotation in one or more of the x, y or z-directions may be used, for example, to undertake accurate leveling of the imprint template (or the patterning surface thereof) with the substrate prior to imprinting.

Figure 7:
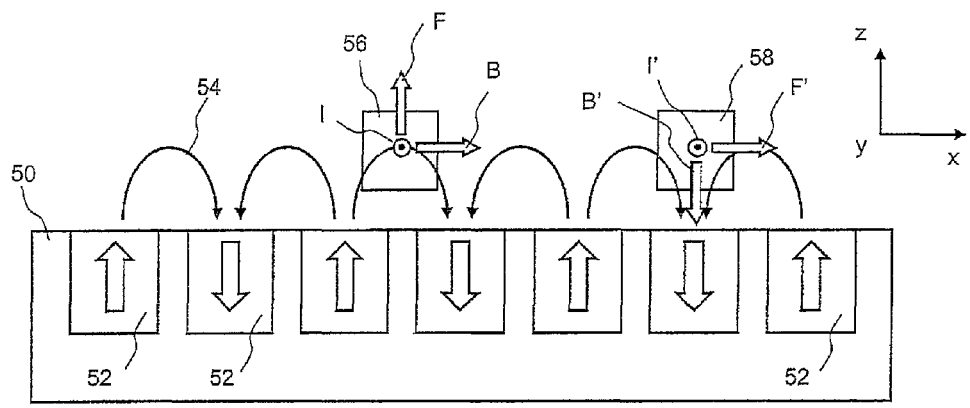
FIG. 7 schematically depicts operating principles associated with the electromagnetic Lorentz actuator according to an embodiment of the invention.

FIG. 7 schematically depicts operating principles associated with embodiments of the invention. A support structure 50 is provided. Fixed within that support structure are a plurality of magnets 52. The plurality of magnets 52 form an array of magnets.

Magnets 52 of the array of magnets have a north pole and a south pole. The north pole and south pole of one or more magnets of the array of magnets are aligned in a first direction. The north pole and south pole of one or more other magnets 52 of the array of magnets are aligned in a second, different direction. The first direction and second direction may be substantially parallel and opposite to one another, for example, in the positive and negative z-directions as shown in the Figure. Each magnet 52 in the Figure is provided with a reference arrow that shows the alignment direction of the north and south poles of each magnet 52. Adjacent magnets 52 may be oriented such that the north pole and south pole of the adjacent magnets 52 are aligned in different directions, for example in the positive and negative z-direction respectively. Magnetic field lines 54 are shown relative to the magnets 52, and these field lines 54 are depicted in a conventional manner as extending from the north poles of the magnets 52 to the south poles of the magnets 52.

A first conductor 56 is shown as being located within the magnetic field lines 54. A current I passes through the first conductor 56 in the y-direction and out of the plane in which the Figure is depicted. At the location in the conductor 56 where the current I passes, the magnetic field line 54 extends in the x-direction.

According to Fleming's left hand rule (for electric motors, which the described actuator is an example of) the direction of the current I and magnetic field B results in a force F (a Lorentz force, hence the term Lorentz actuator) which acts on the first conductor 56 in the z-direction, away from the array of magnets 52. Thus, in this manner, the force F acting on the first conductor 56 may levitate the first conductor above the array of magnets 52.

A second conductor 58 is also shown. A current I' is shown as passing through the second conductor 58 in the y-direction and into the plane in which the Figure is depicted. At the location in which the current I' passes, the magnetic field B' acts in the z-direction, towards the array of magnets 52. According to Fleming's left hand rule (for electric motors, which the described actuator is an example of) this results in a force F' (a Lorentz force) which acts on the second conductor 58 in the x-direction. Such a force F' could thus be used to move the second conductor 58 in the x-direction.

The first conductor 56 and second conductor 58 may be combined into an array of conductors, each conductor 56, 58 extending over a different part (e.g. different magnets) of the array of magnets 52. By appropriate control of the passage of current through each conductor 56, 58 different forces may be made to impart themselves on different parts of the combined conductors 56, 58. These combined forces can be used to, for example, levitate the combined conductor 56, 58 (i.e. move/position the conductors in the z-direction), move the combined conductors 56, 58 in the x or y-directions, and the like.

Generally speaking an array of conductor may be provided. One or more of the conductors of the array of conductors may be configured such that current may be carried in one or more of a first direction and a second direction, the first direction and second direction being substantially perpendicular to one another. According to Fleming's left hand rule (for electric motors, the described Lorentz actuators being an example), certain configurations will allow forces to be selectively imparted on one or more of the conductors in one more directions, for example perpendicular to the first direction, second direction or third direction, with associated movement (i.e. positioning of the array as a whole). Of course, the magnitude and direction of these forces will depend on the location of the conductor or conductors of the array of conductors relative to the magnetic field produced by the array of magnets.

Figure 8:
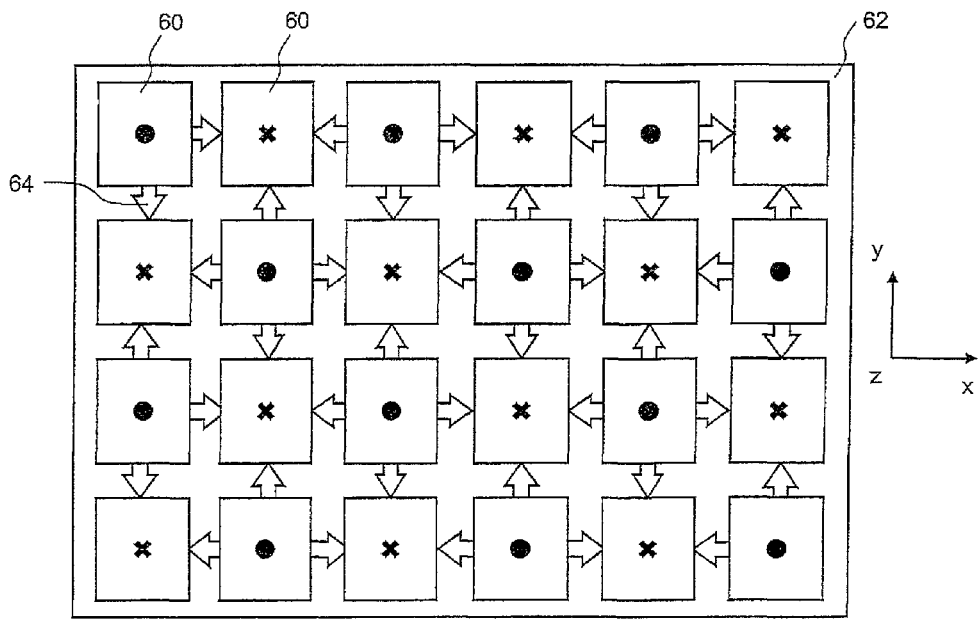
FIG. 8 schematically depicts a plan view of an array of magnets.

FIG. 7 schematically depicted a one-dimensional representation of an array of magnets and two conductors. FIG. 8 schematically depicts a plan view of a more realistic implementation of an embodiment of the invention. FIG. 8 schematically depicts a two-dimensional array of magnets 60 located within a support structure 62. Magnets 60 of the array have a north pole and a south pole. The north pole and south pole of one or more magnets 60 of the array of magnets 60 are aligned in a first direction, and the north pole and south pole of one or more different (i.e. other) magnets 60 of the array of magnets 60 is aligned in a second, different, direction. The first direction and second direction are substantially parallel and opposite to one another. Referring to the Figure, the first and second directions are in the positive and negative z-direction respectively.

The magnets 60 are arranged in rows and columns, thus forming the two dimensional array. The orientation of the north and south poles of adjacent magnets within any column or row is opposite with respect to one another. A representative circle within each magnet 60 identifies a magnet that is orientated such that a line drawn from the south pole to the north pole of the magnet exits perpendicularly away from the plane in which the Figure is depicted. Conversely, a representative cross indicates magnets that are orientated such that a line extending from the south pole to the north pole extends into the plane in which the Figure is depicted. Arrows 64 schematically depicts magnetic field lines that extend between the poles of adjacent magnets 60.

Figure 9:
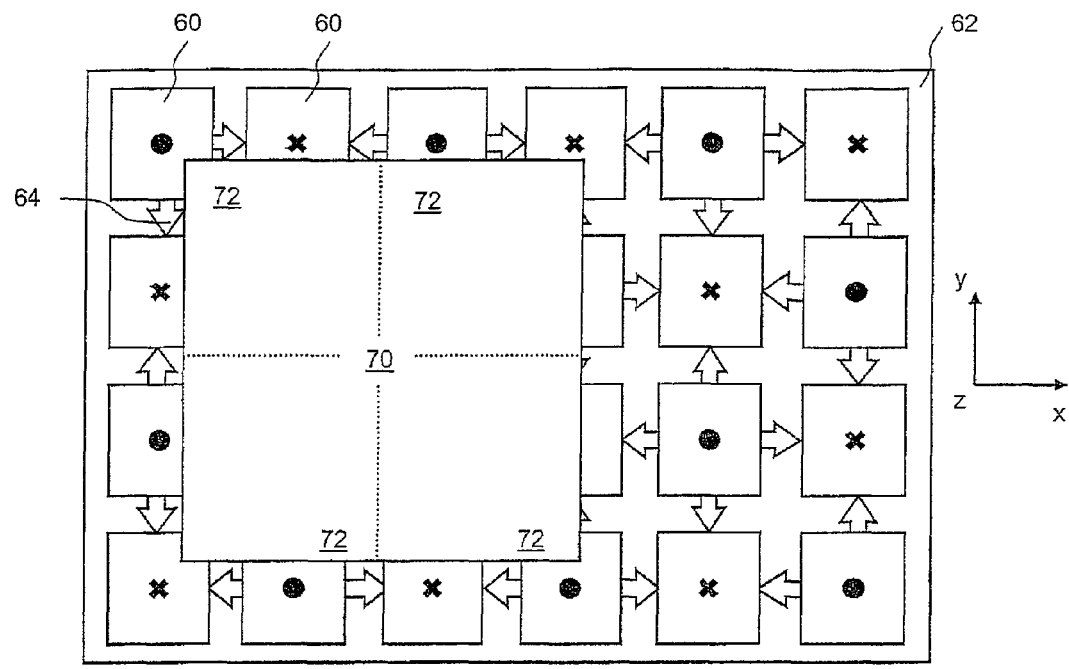
FIG. 9 schematically depicts the array of magnets shown in and described with reference to FIG. 8, together with an array of conductors moveable relative to the array of magnets.

FIG. 9 schematically depicts the same array of magnets shown in and described with reference to FIG. 8. An array of conductors 70 is shown in relation to the array of magnets 60. The array of conductors 70 is moveable relative to the (immoveable) array of magnets 60. The array of conductors 70 comprises a plurality of conductors 72. The conductor 72 may be coils or the like. The conductors 72 may be oriented in any suitable manner which allows for control of movement (i.e. positioning) of the array of conductors 70 as a whole with six degrees of freedom, as discussed above. The conductors 72 may be connected to a controller (not shown). The controller is configured to control the magnitude and/or direction of current that is passed through one, more or all conductors 72 of the array of conductors 70.

In FIGS. 8 and 9, the conductors have been described as extending in the x or y directions (e.g. parallel to rows or columns of magnets). In other embodiments, the conductors may extend in a different direction, for example at 45° to the x or y-directions (e.g. 45° to rows or columns of magnets).

Figure 10:
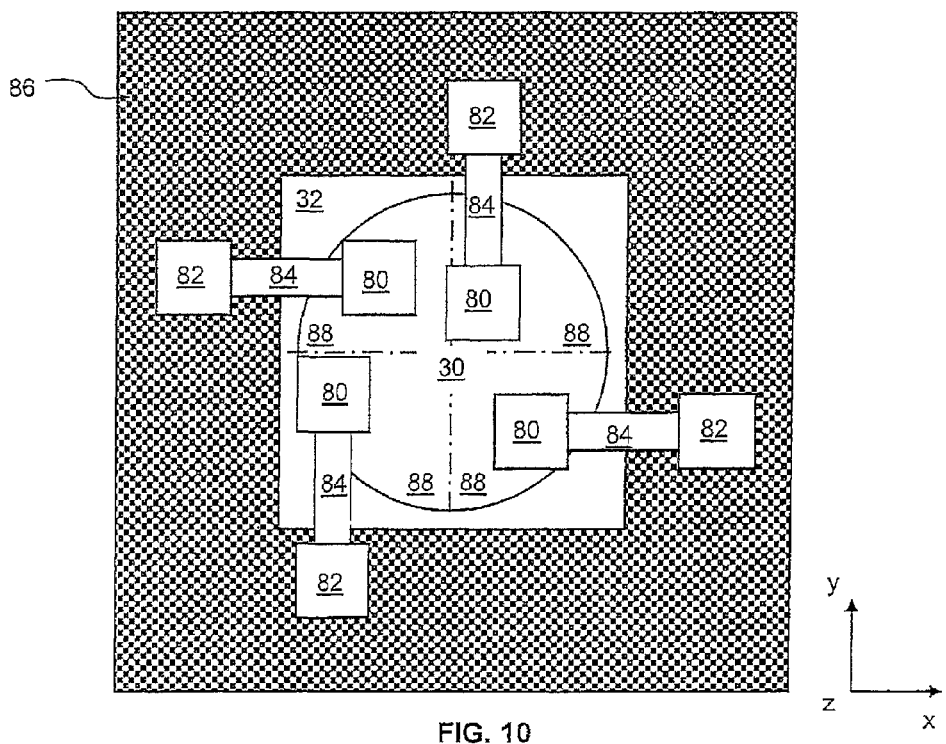
FIG. 10 schematically depicts an imprint lithography apparatus provided with a plurality of imprint template arrangements, each imprint template arrangement being positionable using an electromagnetic Lorentz actuator arrangement in accordance with an embodiment of the invention.

FIG. 3 has schematically depicted a single imprint template arrangement, and the connection of that imprint template arrangement to a moveable array of conductors. Referring now to FIG. 10, an imprint lithography apparatus is shown as comprising a plurality (i.e. four in this embodiment) imprint template arrangements 80. Each imprint template arrangement 80 is connected to a moveable array of conductors 82 by respective connecting members 84, in a similar manner to that discussed above in relation to FIG. 3. Referring back to FIG. 10, each array of conductors 82 may be moved relative to a single array of magnets 86. Alternatively, one or more arrays of magnets may be provided relative to which each individual array of conductors 82 may be moveable.

Each imprint template arrangement 80 may be moveable as discussed above in relation to the single imprint template arrangement embodiment. Each imprint template arrangement 80 may be moved (i.e. positioned) in a specific quadrant 88 of the substrate 30 by a specific array of conductors 82. Using the electromagnetic Lorentz actuators as discussed above, there is no need to provide an actuator arrangement above each imprint template arrangement 80. Instead, the moveable part of the electromagnetic Lorentz actuator arrangement according to an embodiment of the invention (in this example, the array of conductors 82) is moveable alongside and/or around the substrate. It may therefore be easier to implement a multiple-imprint template arrangement configuration as shown in the Figure. This is because a large amount of bulky and cumbersome equipment does not need to be provided above the imprint template arrangement or arrangements. The apparatus as a whole may be relatively flat (in the z-direction) by ensuring that the array of conductors has a planar shape. Lorentz actuators, by their very nature, are substantially planar.

An imprint lithography apparatus may use interferometers to determine the position of an imprint template arrangement. However, when a plurality of imprint template arrangements are used, it may be difficult or impossible to determine the position of all of the imprint template arrangements (or the degree of expansion or rotation of each imprint template arrangement). This is because the presence of the imprint templates themselves may block one or more beams of radiation that need to be used by interferometers to determine the position, degree of expansion and/or degree of rotation of the imprint template arrangements.

Figure 11:
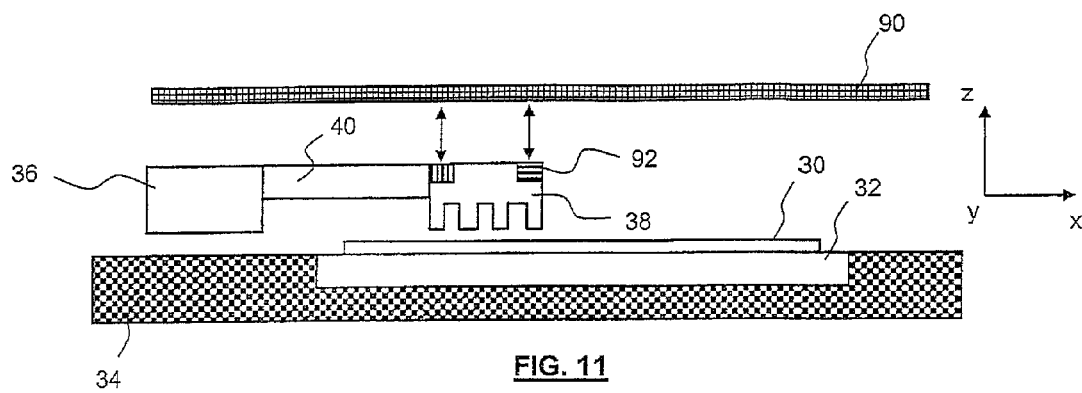
FIG. 11 schematically depicts an imprint lithography apparatus in which an imprint template arrangement is moveable using an electromagnetic Lorentz actuator arrangement in accordance with an embodiment of the invention, together with a plurality of encoders and a structure provided with an array of lines that may together be used to determine the position of the imprint template arrangement.

FIG. 11 schematically depicts an imprint lithography apparatus which may overcome this problem. FIG. 11 schematically depicts substantially the same imprint lithography apparatus that was shown in and described with reference to FIG. 4. Thus, like features appearing in FIG. 4 and FIG. 11 are given like reference numerals. In contrast with the apparatus shown in FIG. 4, the apparatus of FIG. 11 is provided with a configuration determination arrangement configured to determining a configuration of the imprint template arrangement 38 relative to one or more points of reference. The relative configuration may be, for example, a relative transitional position, a relative rotational position, and/or a relative degree of expansion (e.g. a position or orientation). In an example, the configuration determination arrangement comprises a structure 90 located away from the substrate holder and extending across (i.e. substantially parallel to) the substrate holder 32. The structure 90 is located such that, in use, the imprint template arrangement 38 is located between the structure 90 and the substrate holder 32. The structure 90 is provided with one or more arrays of lines (which can be lines adjacent to one another, or a grid, or the like), which provide the fixed point or points of reference referred to previously. The structure 90 may be substantially planar in shape. The structure 90 may be a plate-like shape or the like. The imprint template arrangement 38 is provided with one or more encoders 92 that face towards one or more of the one or more arrays of lines with which the structure 90 is provided.

The encoders 92 and the arrays of lines together constitute a configuration determination arrangement. Arrows in FIG. 11 shows that a path between the encoders 92 and structure 90 is unobstructed, and so the configuration of the imprint template arrangement 38 can be readily determined. Furthermore, the presence of one or more (e.g. four) imprint template arrangements does not obstruct the path between the encoders 92 and array of lines with which the structure is provided 90. This means that the configuration of one, more or all imprint template arrangements used in the apparatus can be readily determined.

A number and/or arrangement of the one or more arrays of lines, and a number and/or arrangement of the encoders may together be sufficient to be able to determine a relative configuration between the imprint template arrangement and the structure in four degrees of freedom. The four degrees of freedom may be movement or translation in a first direction, movement or translation in a second direction, rotation and expansion or contraction. To determine the expansion of an imprint template arrangement is of significance in imprint lithography, since any expansion or contraction of the imprint template arrangement would, if not accounted for, cause deformation or overlay problems in patterns applied to an imprintable medium provided on a substrate. In order to be able to determine the relative configuration in four degrees of freedom, the array of lines may comprise lines extending in a first direction and lines extending in a second direction (e.g. in the form of a grid). The encoders may comprise at least four encoders, at least two of the at least four encoders each being configured to determine movement in a direction relative to the first direction, and at least two others of the at least four encoders each being configured to determine movement in the direction relative to the second direction, the at least four encoders being located around the imprint template arrangement. Alternatively, at least two encoders may be provided, each of at least two encoders being configured to determine movement in a direction relative to the first direction and a direction relative to a second direction, the at least two encoders being located around the imprint template arrangement. The direction relative to the first direction may be substantially perpendicular to the first direction, and the direction relative to the second direction may be substantially perpendicular to the second direction. The first direction may be substantially perpendicular to the second direction.

Alternatively or additionally, a number and/or arrangement of the one or more arrays of lines, and a number and/or arrangement of the encoders, may together be sufficient to be able to determine a relative configuration between the imprint template arrangement and the structure in six degrees of freedom, the six degrees of freedom being: translation in the first direction; translation in the second direction; translation in a third direction (e.g. in three orthogonal directions) and rotation about the first, second and third directions. The encoders may comprise at least six encoders, at least three of the at least six encoders each being configured to determine movement in a direction relative to the first direction, and at least three others of the at least six encoders each being configured to determine movement in the direction relative to the second direction, the at least six encoders being located around the imprint template arrangement. Alternatively, at least three encoders may be provided, each of at least three encoders being configured to determine movement in a direction relative to the first direction and a direction relative to a second direction, the at least three encoders being located around the imprint template arrangement. The direction relative to the first direction may be substantially perpendicular to the first direction, and the direction relative to the second direction may be substantially perpendicular to the second direction. The first direction may be substantially perpendicular to the second direction. Alternatively, at least three encoders may be provided, which are together arranged to take three different measurements in the z-direction (i.e. a third direction), and three tangential degrees of freedom of which two are parallel and the third is orthogonal to the other two. The tangential degrees of freedom may be in the first and second directions, or at 45° to those directions.

Figure 12:
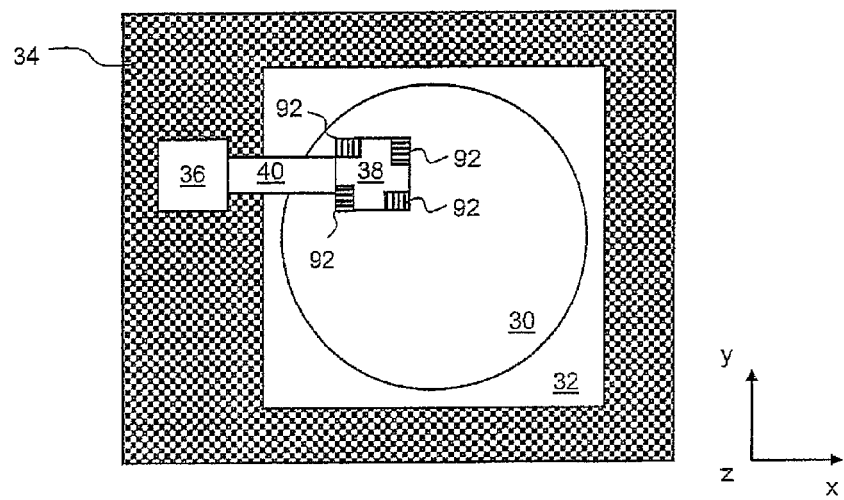
FIG. 12 schematically depicts a plan view of a part of the apparatus shown in and described with reference to FIG. 11.

FIG. 12 is a plan view of the apparatus shown in and described with reference to FIG. 11. In FIG. 12, however, the structure 90 provided with one or more arrays of lines has been removed so that the remaining part of the apparatus may be more clearly seen. In plan view, it can be seen that the imprint template arrangement 38 is provided with four encoders 92, two of the four encoders 92 being configured to determine movement in the x-direction and the other two of the four encoders 92 being configured to determine movement in the y-direction (shown by the differing orientation of the line gratings). This configuration of encoders allows changes in position, rotation and/or expansion to be determined. The electromagnetic Lorentz actuator described above is particularly suited to the embodiments shown in and described with reference to FIGS. 11 and 12.

The electromagnetic Lorentz actuators are, by their very nature, substantially planar in shape. A planar shape allows the actuator to be more easily located between the structure provided with the array of lines and the substrate holder than if the actuator was not planar, for example comprising one or more stacked actuators. The planar shape of a Lorentz actuator thus allows the structure provided with the array of lines to be located closer to the substrate holder and imprint template arrangement, allowing the configuration of the imprint template arrangement to be determined with the encoders more easily or with greater accuracy.

In the above embodiments, the electromagnetic Lorentz actuator arrangement has been described as being used to move (i.e. position) the imprint template arrangement in or with six degrees of freedom. It is sometimes desirable to be able to hold (e.g. clamp) or deform the imprint template arrangement. The imprint lithography apparatus may therefore comprise one or more actuators configured to deform or hold the imprint template arrangement. The one or more actuators may, for example, extend around the imprint template arrangement, or form part of the imprint template arrangement. The one or more actuators may be, for example, one or more piezoelectric actuators, voice coils actuators, screw thread arrangements, or the like.

Figure 13:
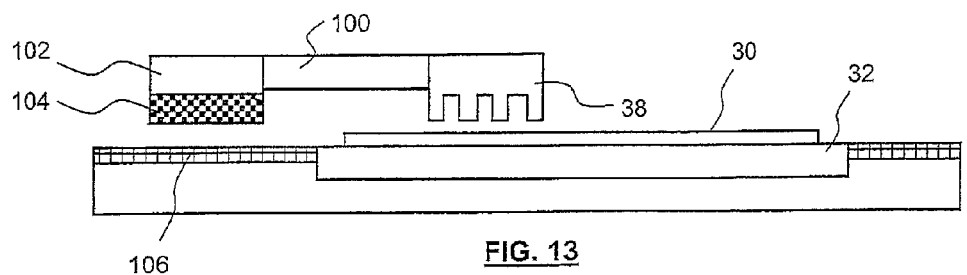
FIG. 13 schematically depicts a side-on view of an imprint lithography apparatus, in which an imprint template arrangement of that apparatus is positionable using an electromagnetic Lorentz actuator arrangement, in accordance with an embodiment of the invention.

In the embodiments of the invention described thus far, the array of conductors has been described as being moveable relative to the array of magnets. In an alternative arrangement, one or more arrays of magnets may be provided which are moveable relative to (and may be levitated relative to) one or more arrays of conductors which are fixed in position. A moveable array of magnets would be connected to a moveable imprint template arrangement. FIG. 13 schematically depicts such an alternative embodiment. A substrate holder 32 is shown as holding a substrate 30. Located above the substrate 30 is an imprint template arrangement 38. The imprint template arrangement 38 is connected by way of a connecting member 100 to a body 102 which supports an array of magnets 104 (for example, the array of magnets discussed above in relation to other embodiments of the invention). The array of magnets 104 is shown as levitating above and relative to an array of conductors 106 (for example the array of conductors discussed above in relation to other embodiments). The array of magnets 104, and thus the imprint template arrangement 38 connected to the array of magnets 104 may be moved (i.e. positioned) in the same way as described above in relation to other embodiments. The difference between this embodiment and previous embodiments is that, in this embodiment, the current is being passed through conductors that are fixed in position in order to move a moveable array of magnets. In the previous embodiments, a current was being passed through conductors of an array of conductors to move the conductors relative to a fixed array of magnets.

In summary, the array of conductors may be moveable and be connected to the imprint template arrangement, the array of conductors being moveable relative to a fixed array (or one or more arrays) of magnets. In an alternative embodiment, an array of magnets may be moveable and be connected to the imprint template arrangement, the array of magnets being moveable relative to a fixed array (or one or more arrays) of conductors. Each alternative embodiment has advantages and disadvantages associated with it. In the embodiment where the array of conductors is moveable, fewer conductors and associated circuitry may be required. This may lead to a cheaper array of conductors and electromagnetic Lorentz actuator as a whole, and could also lead to less heat being generated which could otherwise lead to undesirable expansion of the imprint template. However, in order to be able to provide a moveable array of conductors, a moveable connector would need to be provided. This connector may include wires or cables that need to be connected to the moveable conductors in order to be able to control the passage of current through one or more of these conductors. This connector may also include one or more conduits to provide a cooling medium to the one or more conductors of the array of conductors. Alternatively or additionally, wireless power transfer arrangements may be used, adding to the cost of the apparatus as a whole. Alternatively, if the coils are fixed in position and the magnets are moveable, however, there are no moving wires. However, in order to be able to move a moveable array of magnets, a larger array of conductors will be required and this can be more costly to implement and may generate more heat.

One or more elements may be located between magnets of the array of magnets to manipulate the magnetic field in a desired way. For example, Hallbach elements may be used to enhance the magnetic flux outside of the array of magnets (e.g. to facilitate levitation). Such elements may be used to improve the performance of the Lorentz actuators (e.g., motor performance—K-factor).

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

In an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use 1 template holder arrangement per substrate holder. In an embodiment, there is provided an apparatus configured to use more than 1 template holder arrangement per substrate holder. In an embodiment, there is provided an apparatus that includes a plurality (e.g. 2, 3, or 4) of imprintable medium dispensers. In an embodiment, there is provided an apparatus configured to use 1 dispenser per substrate holder. In an embodiment, there is provided an apparatus configured to use 1 dispenser per imprint template arrangement.

In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, 2 or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus is shared among all substrate holders.

The invention claimed is:

1. An imprint lithography apparatus comprising:
   an imprint template arrangement for use in imprinting a pattern into an imprintable medium provided on a substrate;
   a substrate holder configured to hold the substrate;
   an electromagnetic Lorentz actuator arrangement configured to move the imprint template arrangement, the electromagnetic Lorentz actuator arrangement comprising:
   an array of magnets, and
   an array of conductors, each conductor configured to carry an electric current,
   one of the array of magnets or the array of conductors being moveable and connected to the imprint template arrangement, and the other of the array of magnets or the array of conductors extending at least partially around or forming a part of the substrate holder, and
   the array of magnets and the array of conductors together being in a configuration which facilitates moving of the moveable one of the array of magnets or the array of conductors in six degrees of freedom, such that the imprint template arrangement is also movable in six degrees of freedom.

2. The apparatus of claim 1, further comprising one or more further imprint template arrangements, each further imprint template arrangement being connected to a further moveable one of an array of magnets or an array of conductors, the other of the array of magnets or the array of conductors extending at least partially around or forming a part of the substrate holder.

3. The apparatus of claim 1, further comprising an actuator configured to deform or hold the imprint template arrangement.

4. The apparatus of claim 1, further comprising a structure located away from the substrate holder and extending across the substrate holder, and such that the imprint template arrangement is, in use, located between the structure and the substrate holder, the structure having one or more arrays of lines, and the imprint template arrangement having one or more encoders that face towards one or more of the one or more arrays of lines.

5. The apparatus of claim 4, wherein a number and/or arrangement of the one or more arrays of lines, and a number and/or arrangement of the one or more encoders, is together sufficient to be able to determine a relative configuration between the imprint template arrangement and the structure in six degrees of freedom, the six degrees of freedom being:
   translation in a first direction;
   translation in a second direction;
   translation in a third direction;
   rotation about the first direction;
   rotation about the second direction; and
   rotation about the third direction.

6. The apparatus of claim 4, wherein a number and/or arrangement of the one or more arrays of lines, and a number and/or arrangement of the one or more encoders, is together sufficient to be able to determine a relative configuration between the imprint template arrangement and the structure in four degrees of freedom, the four degrees of freedom being:
   translation in a first direction;
   translation in a second direction;
   rotation; and
   expansion or contraction.

7. The apparatus of claim 5, wherein the relative configuration is a relative translational position and/or a relative rotational position.

8. The apparatus of claim 1, wherein the array of magnets is provided with Hallbach elements configured to enhance the magnetic flux outside of the array of magnets.

9. The apparatus of claim 1, further comprising a control arrangement configured to pass a current through a conductor of the array of conductors to move the moveable one of the array of magnets or the array of conductors.

10. The apparatus of claim 1, wherein magnets of the array of magnets have a north pole and a south pole, the north pole and south pole of one or more magnets of the array of magnets being aligned in a first direction, and the north pole and south pole of one or more other magnets of the array of magnets being aligned in a second, different, direction, the first direction and second direction being substantially parallel and opposite to one another.

11. The apparatus of claim 1, wherein one or more conductors of the array of conductors is configured such that current may be carried in a first direction and/or a second direction, the first direction and second direction being substantially perpendicular to one another.

12. The apparatus of claim 1, wherein the moveable one of the array of magnets or the array of conductors is, in use, configured to levitate above the other of the array of magnets or the array of conductors.

13. The apparatus of claim 1, wherein the array of conductors is moveable and is connected to the imprint template arrangement.

14. The apparatus of claim 1, wherein the array of magnets is moveable and is connected to the imprint template arrangement.

15. The apparatus of claim 1, wherein the six degrees of freedom are:
   movement along a first axis;
   movement along a second axis;
   movement along a third axis, the first, second and third axes being orthogonal with respect to one another;
   rotation about the first axis;
   rotation about the second axis; and
   rotation about the third axis.

16. An imprint lithography method, comprising:
   moving an imprint template arrangement for use in imprinting a pattern into an imprintable medium provided on a substrate held by a substrate holder, using an electromagnetic Lorentz actuator arrangement, the electromagnetic Lorentz actuator arrangement comprising:
   an array of magnets, and
   an array of conductors, each conductor configured to carry an electric current,
   one of the array of magnets or the array of conductors being moveable and connected to the imprint template arrangement, and the other of the array of magnets or the array of conductors extending at least partially around or forming a part of the substrate holder, and the array of magnets and the array of conductors together being in a configuration which facilitates moving of the moveable one of the array of magnets or the array of conductors in six degrees of freedom, such that the imprint template arrangement is also movable in six degrees of freedom; and imprinting a pattern into the imprintable medium provided on the substrate using the imprint template arrangement.

17. The method of claim 16, wherein the imprint template arrangement is located between the substrate holder and a structure located away from the substrate holder and extending across the substrate holder, the structure having one or more arrays of lines, and the imprint template arrangement having one or more encoders that face towards one or more of the one or more arrays of lines.

18. The method of claim 17, wherein a number and/or arrangement of the one or more arrays of lines, and a number and/or arrangement of the one or more encoders, is together sufficient to be able to determine a relative configuration between the imprint template arrangement and the structure in at least four degrees of freedom, the four degrees of freedom being:

translation in a first direction;
translation in a second direction;
rotation; and
expansion or contraction.

19. The method of claim 16, wherein the moveable one of the array of magnets or the array of conductors levitates during imprinting above the other of the array of magnets or the array of conductors.

20. The method of claim 16, further comprising using an actuator to deform or hold the imprint template arrangement.

* * * * *